United States Patent [19]
Burns

[11] Patent Number: 5,615,475
[45] Date of Patent: Apr. 1, 1997

[54] METHOD OF MANUFACTURING AN INTEGRATED PACKAGE HAVING A PAIR OF DIE ON A COMMON LEAD FRAME

[75] Inventor: Carmen D. Burns, Austin, Tex.

[73] Assignee: Staktek Corporation, Austin, Tex.

[21] Appl. No.: 517,485

[22] Filed: Aug. 21, 1995

Related U.S. Application Data

[62] Division of Ser. No. 380,542, Jan. 30, 1995, abandoned.

[51] Int. Cl.$^6$ .................................................. H01R 43/00
[52] U.S. Cl. ........................ 29/827; 257/686; 264/272.11
[58] Field of Search .......................... 29/827, 854, 855, 29/856; 264/272.11, 272.17; 257/777, 686

[56] References Cited

U.S. PATENT DOCUMENTS

| | | | |
|---|---|---|---|
| 3,746,934 | 7/1973 | Stein | 317/101 |
| 4,103,318 | 7/1978 | Schwede | 361/388 |
| 4,288,841 | 9/1981 | Gogal | 361/414 |
| 4,437,235 | 3/1984 | McIver | 29/840 |
| 4,630,172 | 12/1986 | Stenerson et al. | 361/386 |
| 4,680,617 | 7/1987 | Ross | 357/72 |
| 4,763,188 | 8/1988 | Johnson | 357/74 |
| 4,823,234 | 4/1989 | Konishi et al. | 361/386 |
| 4,878,106 | 10/1989 | Sachs | 357/72 |
| 5,012,323 | 4/1991 | Farnworth | 357/75 |
| 5,016,138 | 5/1991 | Woodman | 361/381 |
| 5,034,350 | 7/1991 | Marchisi | 29/827 |
| 5,057,906 | 10/1991 | Ishigami | 357/80 |
| 5,101,324 | 3/1992 | Sato | 361/400 |
| 5,227,995 | 7/1993 | Klink et al. | 365/63 |
| 5,250,845 | 10/1993 | Runyan | 257/729 |
| 5,262,927 | 11/1993 | Chia et al. | 257/707 |
| 5,279,029 | 1/1994 | Burns | 29/856 |
| 5,347,429 | 9/1994 | Kohno et al. | 257/777 |
| 5,359,222 | 10/1994 | Okutomo et al. | 257/659 |
| 5,359,225 | 10/1994 | Haley | 257/671 |
| 5,389,817 | 2/1995 | Imamura et al. | 257/666 |
| 5,402,006 | 3/1995 | O'Donley | 257/712 |

FOREIGN PATENT DOCUMENTS

| | | |
|---|---|---|
| 461-639-A | 12/1991 | European Pat. Off. . |
| 57-31166A | 2/1982 | Japan . |
| 58-96756A | 6/1983 | Japan . |
| 62-76661 | of 1987 | Japan . |
| 1-119045A | 5/1989 | Japan . |
| 5-21697A | 1/1993 | Japan . |

OTHER PUBLICATIONS

"3D Interconnection For Ultra–Dense Multichip Modules," Abstract, Christian VAL, IEEE, pp. 540–547.

*Primary Examiner*—P. W. Echols
*Assistant Examiner*—Adrian L. Coley
*Attorney, Agent, or Firm*—Fulbright & Jaworski, L.L.P.

[57] ABSTRACT

This invention is for an integrated circuit package which includes two integrated circuit die connected to a common substantially planar lead frame, wherein bond pads on each die face the common lead frame.

23 Claims, 4 Drawing Sheets

```
┌─────────────────────────────────────┐
│ Apply a high temperature polymer    │
│ between the first integrated        │
│ circuit die and the lead frame.     │
└─────────────────────────────────────┘
                  │
┌─────────────────────────────────────┐
│ Apply a high temperature polymer    │
│ between the second integrated       │
│ circuit die and the opposite side   │
│ of the lead frame.                  │
└─────────────────────────────────────┘
                  │
┌─────────────────────────────────────┐
│ Heat the package to cure the high   │
│ temperature polymer.                │
└─────────────────────────────────────┘
                  │
┌─────────────────────────────────────┐
│ Apply a double-sided polyimide tape │
│ between the first die and the lead  │
│ frame and between the second die    │
│ and the opposite side of the lead   │
│ frame.                              │
└─────────────────────────────────────┘
                  │
┌─────────────────────────────────────┐
│ Compress the high temperature       │
│ polymer, polyimide tape, the two    │
│ die and the lead frame together to  │
│ form an assembly.                   │
└─────────────────────────────────────┘
                  │
┌─────────────────────────────────────┐
│ Heat the assembly to cure the       │
│ adhesive layers.                    │
└─────────────────────────────────────┘
```

METHOD OF MANUFACTURING AN INTEGRATED PACKAGE HAVING A PAIR OF DIE ON A COMMON LEAD FRAME

This application is a divisional of application Ser. No. 08/380,542, filed Jan. 30, 1995, now abandoned Apr. 4,1996.

BACKGROUND OF THE INVENTION

1. Field of the Invention

This invention relates to a high density integrated circuit package having a plurality of integrated circuit die attached to a common lead frame.

2. Discussion of the Related Technology

Modern microprocessor-based computer systems, including personal computers, require increased memory storage capability, with faster access which, nonetheless, use the same space on mother boards or other printed circuit boards as prior memory devices. Apparatus and methods for achieving a high density, three-dimensional integrated circuit memory package having a small footprint are described in U.S. Pat. No. 5,279,029, entitled Ultra High Density IC Packages Method, and U.S. Pat. No. 5,367,766, also entitled Ultra High Density IC Packages Method, both assigned to the common assignee of the present invention.

These related patents describe an apparatus and method of manufacturing a three-dimensional high density integrated circuit module, which provides a plurality of individual integrated circuit packages stacked vertically without additional board space. In these ultra high density modules electrical leads extending from each of the individual integrated circuit packages in the module are electrically coupled to each other and to external circuitry via an external conductive rail assembly.

For flash memory applications, such as smart cards and the like, even greater memory density is required. That is, more memory in a low profile package is needed without increasing the footprint area of the device and without increasing the number of electrical leads extending from such a package.

SUMMARY OF INVENTION

The present invention provides a low profile very high density integrated circuit memory device. The design of the present invention includes at least two integrated circuit die mounted with the active surfaces facing a common lead frame. The die and lead frame are contained within a protective casing. The design of the present invention can be used with any suitable integrated circuit dies, but is particularly well suited for use with high density flash memory devices. The packaging design of the present invention provides a higher density memory device without increasing the package profile, footprint or the total number of leads necessary for interconnection to external circuitry.

In the preferred embodiment, each die includes a single row of wire bond pads located on an outer edge of the active or signal surface of the die. The mounted die are slightly offset from one another so the single row of wire bond pads on each die are exposed and not overlaid by the other die to facilitate wire bonding to the lead frame. The bonding wires, which are attached to the wire bond pads on each die, are then connected to the common lead frame disposed between the two die by wire bonding, wedge bonding or thermal compression bonding the end of each bonding wire to a bonding pad on the common lead frame. The common lead frame overlays a substantial portion of the surface of each die and is mounted to each die by a double-sided polyimide tape, or by a high-temperature adhesive or epoxy layer.

After the two die are mounted to the common lead frame, and the die wire bond pads attached by bond wires to the lead frame bonding pads, the die, lead frame and bonding wires are encased in a transfer molding material. The transfer molding is injected into a mold forming a protective casing which fills any voids in and around the die, the wire bond pads and the bond wires. This ensures the integrity of the wire bond connections. After molding, the upper and/or lower major surfaces of the casing are lapped to provide a thinner high density integrated circuit package. Metal foil may be laminated to the top and/or bottom of the lapped package to provide better thermal heat dissipation from the package.

BRIEF DESCRIPTION OF THE DRAWINGS

FIGS. 3 and 4 are flow diagrams illustrating differing embodiments of practicing the present invention.

DETAILED DESCRIPTION OF THE PREFERRED EMBODIMENT

Figure 1:
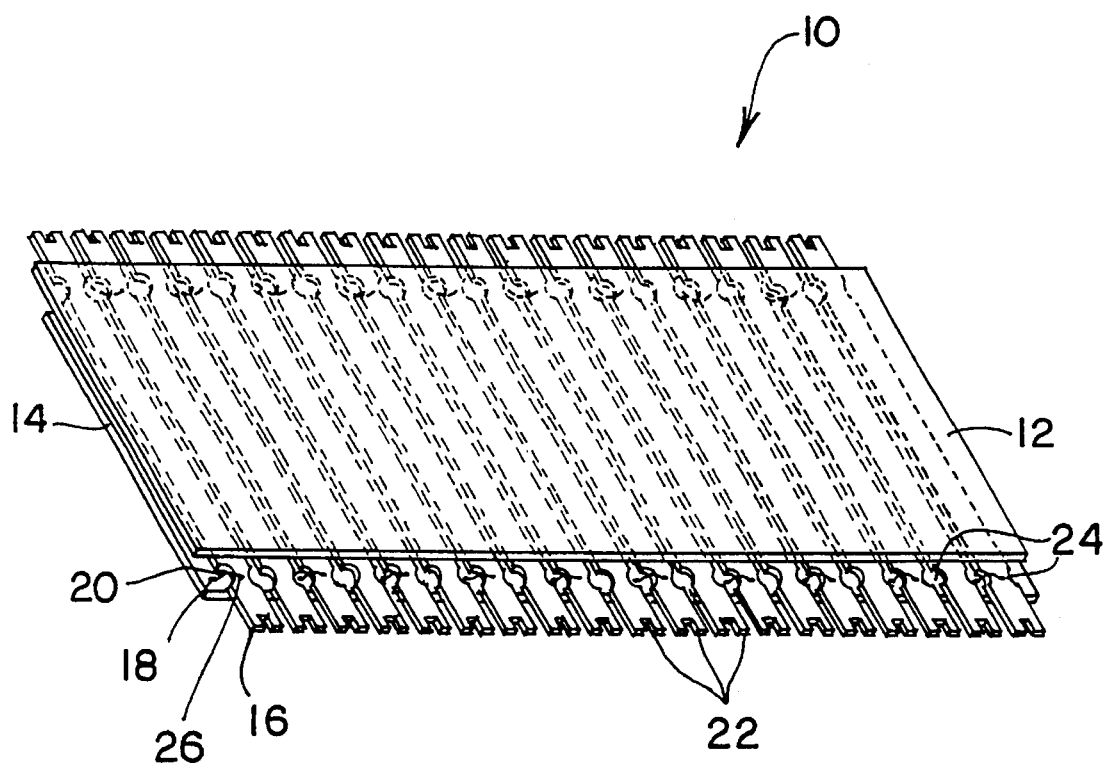
FIG. 1 is a perspective view of a schematic representation of the connectivity of the double-die mounted to common lead frame configuration of the present invention.

In FIG. 1, the double-die integrated circuit package 10 of the present invention is illustrated. An upper integrated circuit die 12 is laminated to a common lead frame 16. Common lead frame 16, preferably 3.0 mil thick copper, includes a plurality of individual substantially planar electrical conductors 22. A second integrated circuit die 14 is laminated to an opposite side of common lead frame 16.

As shown in FIG. 1, upper integrated circuit die 12 and lower integrated circuit die 14 are both mounted with their active surfaces, the surface which includes circuit interconnection wire bond pads 18, facing a common lead frame 16 and are slightly offset from each other so the wire bond pads 18 on each die are exposed and are easily accessible for wire bonding, wedging or wire compression bonding wires 20 to bonding pads 26 on each electrical conductor 22 of lead frame 16 during the manufacturing process. FIG. 1 schematically illustrates each integrated circuit die 12 and 14 which includes a single row of wire bond pads 18 disposed in a single column configuration along an outer edge of each die. It should be understood that wire bond pads 18 may be arranged near an edge of each die in a non-linear configuration, such as a plurality of staggered rows, or otherwise. At a minimum, the wire bond pads 18 for each integrated circuit die 12 and 14 are located within an area near an outer edge of each die. The area of wire bond-pads 18 for each die 12 or 14 is not overlaid by the other respective die when the two die 12 and 14 are mounted to common lead frame 16.

The electrical connectivity of package 10 between wire bond pads 18 and electrical conductors 22 of lead frame 16 illustrated in FIG. 1 does not necessarily represent the actual connectivity of package 10. FIG. 1 is merely illustrative of the general arrangement of the bond pads 18 and lead frame 16. The actual selective connectivity of package 10 is determined by: 1) the presence or absence of a wire bond pad 18 for each electrical conductor 22; 2) the pattern and layout of the electrical conductors 22 of lead frame 16, which may not all run parallel to each other as shown in FIG.

1; and/or 3) selectively connecting certain of the electrical conductors 22 to an external rail assembly, as described in commonly assigned U.S. Pat. Nos. 5,279,029 and 5,367,766, referenced previously.

Preferably, electrical conductors 22 include notches 24 which allow bonding wires 20 to be looped over and attached to bonding pads 26 on lead frame 16 more easily, since there is limited space between each electrical conductor 22. Attempting to loop bonding wires 20 without the notches 24 would be more difficult and time consuming. The electrical connections for upper integrated circuit die 12 between wire bond pads (not shown) on upper die 12 and lead frame 16 are schematically illustrated and are identical to the connections for lower die 14.

Figure 2:
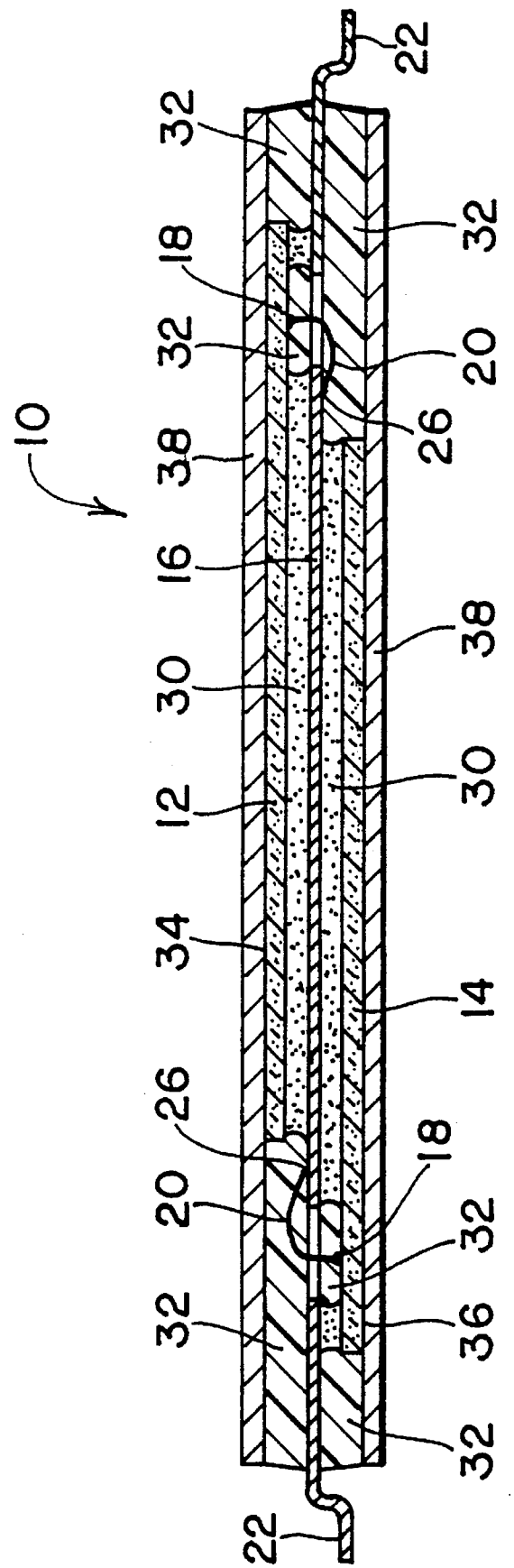
FIG. 2 is a cross-sectional view of the double-die configuration of the present invention.

Preferably, several process steps are followed to create the double die integrated circuit package 10 of the present invention. Referring to FIG. 2, the upper integrated circuit die 12, or lower integrated circuit die 14, is first mounted to lead frame 16 using an adhesive layer 30, which is a high temperature non-conductive adhesive, such as polyimide tape, or a low shrink epoxy. After this step, the remaining unattached integrated circuit die is mounted to lead frame 16 using an adhesive layer 30. The bonding wires 20 of the two integrated circuit die 12 and 14 are then attached, via solder wedge bonding or thermal compression bonding, to wire bond pads 18 of each die. Bonding wires 20 are then soldered, wedge bonded or thermal compression bonded to bonding pads 26 of select electrical conductors 22 on common lead frame 16.

Once the two die 12 and 14 are mounted to common lead frame 16 and all electrical interconnections between the two die 12 and 14 and the common lead frame 16 are made, the assembly is inserted into a molding chamber, as described in U.S. Pat. No. 5,279,029, issued to Burns, entitled Ultra High Density IC Packages Method, which is incorporated herein in its entirety for all purposes. The double die and common lead frame assembly is then encased with an injected plastic transfer molding material 32. The transfer molding material 32 is injected so it fills in any voids in and around either die 12 or 14, the wire bond pads 18, the bonding wires 20 and bonding pads 26.

After hardening, package 10 is removed from the mold and both the upper and lower major surfaces, 34 and 36, of the package 10 are lapped until the desired thickness of the overall package 10 is achieved. Next, edges of package 10 are covered with a masking means, such as a rubber gripper, tape or liquid solder stop. The transfer molded material 32 and exposed silicon die 12 or 14 after lapping are then pretreated with a plating pretreatment. The unmasked areas of the package 10 are then electroless plated. An electrode is attached and the entire package 10 is electroplated with a very thin layer of copper, nickel or chrome, or any continuous metal layer, forming a light tight seal free of imperfections or pinholes. The masking is then removed and the integrated circuit package 10 of the present invention is achieved.

Figure 3:
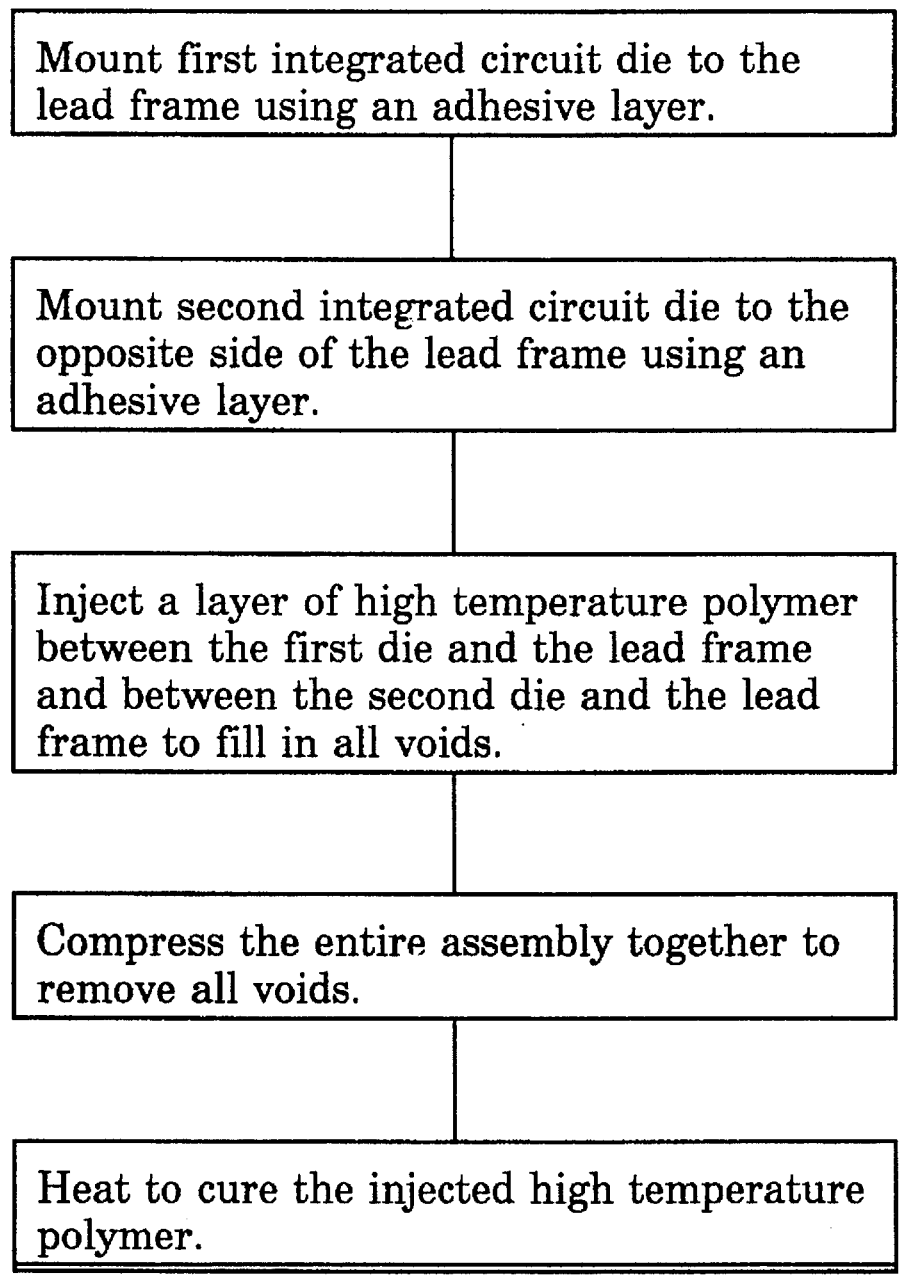

In another embodiment, after the upper and lower die 12 and 14 are mounted to the common lead frame 16 with adhesive layer 30, a layer of high temperature polymer, which is preferably a low shrink epoxy, such as ABLE-STICK brand B-staged epoxy, is injected between the upper die 12 and the common lead frame 16 and between the lower die 14 and the common lead frame 16 to fill all voids. The entire assembly is then compressed to squeeze together the layers to remove all voids, and is then heated to cure the injected epoxy. Alternative methods of achieving the package 10 are illustrated in FIGS. 3 and 4.

In an alternative embodiment, after being encased by molding material 32, the upper and/or lower major outer surfaces 34 and 36 of the casing are lapped to provide a thin, high density integrated circuit package 10. A thin layer of metal foil 38 may be mounted to the top and/or bottom surface 34 and 36 of package 10 to provide better thermal heat dissipation from package 10.

The integrated circuit package 10 of the present invention is warp balanced, that is, the assembly which includes the two die 12, 14 and the common lead frame 16 disposed therebetween results in a warp resistant, zero warp structure due to the center line balance achieved with the two die 12, 14 being mounted one over another on a common lead frame 16. Because of this configuration, the die 12, 14 and common lead frame 16 assembly will remain essentially planar, since any warping forces on one die will be offset by warping forces of equal magnitude and opposite direction on the remaining die. Thus, a warp resistant, substantially planar package 10 is achieved.

The foregoing disclosure and description of the invention are illustrative and explanatory of the preferred embodiments, and changes in the individual components, elements or connections may be made without departing from the spirit of the invention and the scope of the following claims.

What is claimed is:

1. A method of manufacturing a high density integrated circuit package, which includes two integrated circuit die disposed within said package, comprising the steps of:

providing a first and a second integrated circuit die, wherein each said die includes bonding pads on a major surface of each said die;

mounting a substantially planar lead frame, said lead frame including a first and a second major surface, to said first and said second die, wherein said lead frame substantially overlays each of said integrated circuit die; and electrically connecting said lead frame to said bonding pads on said first and said second die.

2. The method of claim 1, further comprising the step of encapsulating substantially said first die, said second die and said lead frame in a casing.

3. The method of claim 2, wherein said step of encapsulating includes the steps of injecting a transfer molded material between said first die, said second die, said electrical connections and said lead frame to fill any voids therebetween.

4. The method of claim 2, wherein said casing comprises transfer molded plastic.

5. The method of claim 2, further comprising the step of lapping an upper major surface and/or a lower major surface of the exterior of said casing.

6. The method of claim 2, further comprising the step of mounting a thin metal foil layer to an upper major surface and/or a lower major surface of the exterior of said casing.

7. The method of claim 1, wherein said lead frame is substantially planar and is comprised of a plurality of electrical conductors.

8. The method of claim 7, wherein said step of electrically connecting is accomplished by wire bonding wires between said bonding pads on each said die to said lead frame electrical conductors.

9. The method of claim 7, wherein said steps of electrically connecting is accomplished by thermal compression bonding wires between said bonding pads on each said die to said lead frame electrical conductors.

10. The method of claim 7, wherein at least one bonding pad on said first die and at least one bonding pad on said second die are electrically connected to a common lead frame electrical conductor.

11. The method of claim 1, wherein said lead frame is comprised of 3.0 mil thick copper.

12. The method of claim 1, wherein said step of mounting includes the step of applying a double-sided polyimide tape between said first die and said first major surface of said lead frame and between said second die and said second major surface of said lead frame.

13. The method of claim 12, wherein said step of mounting includes the step of applying a high temperature polymer between said first major surface of said lead frame and said first die, and between said second major surface of said lead frame and said second die, prior to applying said double-sided tape.

14. The method of claim 13, wherein after said step of mounting is accomplished, and prior to said step of applying said double-sided tape, said package is heated to cure said high temperature polymer.

15. The method of claim 13, wherein said high temperature polymer is a B-staged epoxy.

16. The method of claim 13, wherein after said high temperature polymer and said polyimide tape are applied, said first die, said second die, said lead frame are compressed together to form an assembly.

17. The method of claim 16, wherein after being compressed, said assembly is heated to cure said epoxy.

18. A method of manufacturing a high density integrated circuit package, comprising the steps of:

providing a first and a second integrated circuit die, wherein each said die includes a plurality of bonding pads disposed in close proximity to an edge of a major surface of each said die;

mounting a substantially planar lead frame, which includes a first and a second major surface, to said first and second die such that said first major surface of said lead frame is mounted to said major surface of said first die having said bonding pads, and said second major surface of said lead frame is mounted to said major surface of said second die having bonding pads, wherein said lead frame substantially overlays each of said integrated circuit die;

electrically connecting said lead frame to said bonding pads on said first and said second die; and encapsulating substantially said first die, said second die and said lead frame in a casing.

19. The method of claim 18, wherein said step of electrically connecting is accomplished by wire bonding wires between said bonding pads of each said die and said lead frame.

20. The method of claim 18, wherein step of electrically connecting is accomplished by thermal compression bonding wires between said bonding pads on each said die and said lead frame.

21. The method of claim 18, wherein said step of mounting a substantially planar lead frame is accomplished by the following steps:

mounting said first and said second die to said lead frame using a double-sided polyimide tape;

injecting an epoxy between said first and second die and said lead frame; and compressing said first die, said second die, said epoxy, said double-sided tape and said lead frame together to form an assembly.

22. The method of claim 21, further comprising the step of heating said assembly to cure said epoxy.

23. A method of achieving a warp resistant integrated circuit assembly, comprising the steps of:

mounting a first integrated circuit die to a first major surface of a substantially planar lead frame, wherein said lead frame is comprised of a plurality of electrical conductor elements; and mounting a second integrated circuit die to a second major surface of said substantially planar lead frame, wherein said lead frame substantially overlays each of said integrated circuit die, wherein said first and second die each include a plurality of wire bond pads, wherein said wire bond pads on each said die are disposed along an outer edge of a major surface of each said die, and wherein said first and second die overlay each other to expose said wire bond pads on each said die.

* * * * *

UNITED STATES PATENT AND TRADEMARK OFFICE
CERTIFICATE OF CORRECTION

PATENT NO. : 5,615,475
DATED : April 1, 1997
INVENTOR(S) : Burns

It is certified that error appears in the above-identified patent and that said Letters Patent is hereby corrected as shown below:

On the title page, item [54] should be

Method of Manufacturing an Integrated <u>Circuit</u> Package Having a Pair of Die on a Common Lead Frame Signed and Sealed this Thirtieth Day of May, 2000

Attest:

Q. TODD DICKINSON

*Attesting Officer*   *Director of Patents and Trademarks*